US006873173B2

(12) United States Patent
Kollmer et al.

(10) Patent No.: US 6,873,173 B2
(45) Date of Patent: Mar. 29, 2005

(54) TEST CIRCUIT ARRANGEMENT AND METHOD FOR TESTING A MULTIPLICITY OF TRANSISTORS

(75) Inventors: Ute Kollmer, Munich (DE); Ulrich Schaper, Munich (DE); Carsten Linnenbank, Munich (DE); Roland Thewes, Grobenzell (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/220,449

(22) PCT Filed: Mar. 5, 2001

(86) PCT No.: PCT/DE01/00835

§ 371 (c)(1),
(2), (4) Date: Jan. 13, 2003

(87) PCT Pub. No.: WO01/67601

PCT Pub. Date: Sep. 13, 2001

(65) Prior Publication Data

US 2003/0112028 A1 Jun. 19, 2003

(30) Foreign Application Priority Data

Mar. 10, 2000 (DE) .......................................... 100 11 657

(51) Int. Cl.[7] .............................................. G01R 31/26
(52) U.S. Cl. ....................................... 324/769; 324/765
(58) Field of Search ................................ 324/763–770, 324/73.1, 158.1; 438/14–18

(56) References Cited

U.S. PATENT DOCUMENTS 4,972,144 A * 11/1990 Lyon et al. .................. 324/765

5,223,792 A * 6/1993 El-Ayat et al. .............. 324/765
6,489,798 B1 * 12/2002 Scott-Thomas et al. ..... 324/765

FOREIGN PATENT DOCUMENTS

DE 692 17 827 T2 5/1993

OTHER PUBLICATIONS

C. Linnenbank et al., What Do Matching Results of Medium Area MOSFETs Reveal for Large Area Devices in Typical Analog Applications? Proceedings of the 28th European Solid–State Device Research Conference, ESSDRC 1998, Bordeaux, France, pp. 104–107, Sep. 8–10, 1998.
M. Eisele et al., Intra–Die Device Parameter Variations and Their Impact on Digital CMOS Gates at Low Supply Voltages, IEEE, IEDM 1005, pp. 67–70, 1995.
K. R. Lakshmikumar et al., Characterization and Modeling of Mismatch in MOS Transistors for Precision Analog Design, IEEE Journal of Solid–State Circuits, vol. SC–21, No. 6, pp. 1057–1066, Dec., 1986.
M.J.M. Pelgrom et al., Transistor Matching in Analog CMOS Applications, IEEE, International Electron Devices Meeting, San Francisco, CA, IEDM 98, pp. 915–918, Dec. 6–9, 1998.

(Continued)

Primary Examiner—Vinh P. Nguyen
(74) Attorney, Agent, or Firm—Altera Law Group, LLC; Jeffrey R. Stone

(57) ABSTRACT

The invention relates to a test circuit configuration. Every gate terminal of a transistor to be tested is coupled to a gate voltage source in such a manner that the gate voltage can be measured and adjusted individually on every gate terminal. The source terminal of every transistor to be tested can be coupled to the source voltage source in such a manner that the source voltage can be measured and adjusted individually on every source terminal.

11 Claims, 3 Drawing Sheets

OTHER PUBLICATIONS

K. Goser, MOS Transistors as High–speed switches in a Selection Matrix, NTZ, lllue 10, pp. 512–521, 1970.

Thewes R et al., On the Matching Behavior of MOSFET Small Signal Parameters, Proceedings of the 2000 International Conference on Microelectronic Test Structures, pp. 137–141, Mar. 13–16, 2000.

Portmann L. et al., A High Density Integrated Text Matrix of MOS Transistors for Matching Study, Proc. IEEE 1998 Int. Conference on Microelectronic Test Structures. vol. 11, Mar. 1998.

Thewes, R. et al., Explanation and Quantitative Model for the Matching Behavior of Poly–Silicon Resistors. International Electron Devices Meeting 1998. IEDM Technical Digest. San Francisco, CA, Dec. 6–9, 1998, pp. 98–771–774.

Chong–Fun Yu et al., An Accurate and Matching–Free Threshold Voltage Extraction Scheme for MOS Transistors. Circuits and Systems, 1994. 1994 IEEE Intl. Symposium, London UK, May 30–Jun. 2, 1994, pp. 115–118.

* cited by examiner

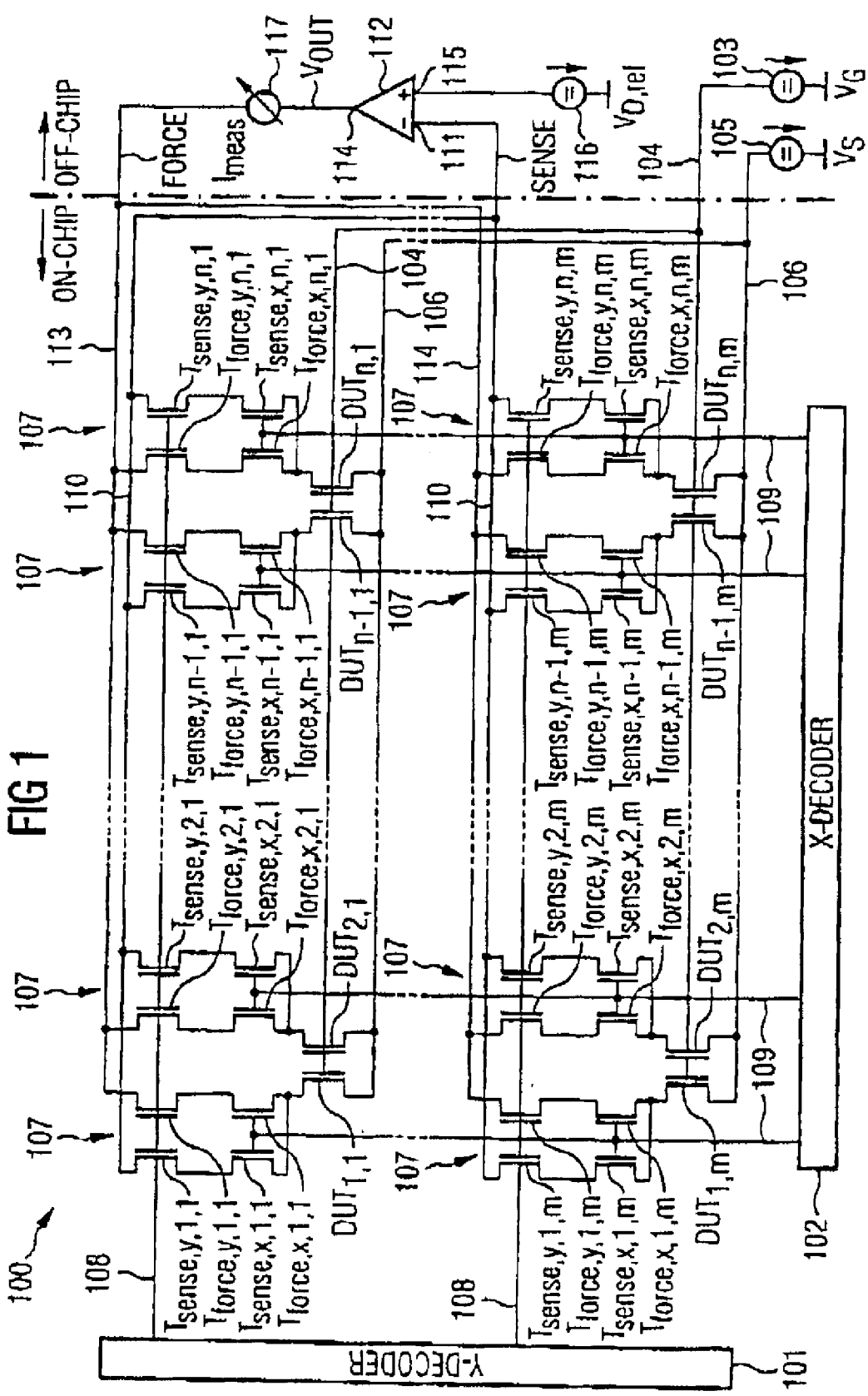

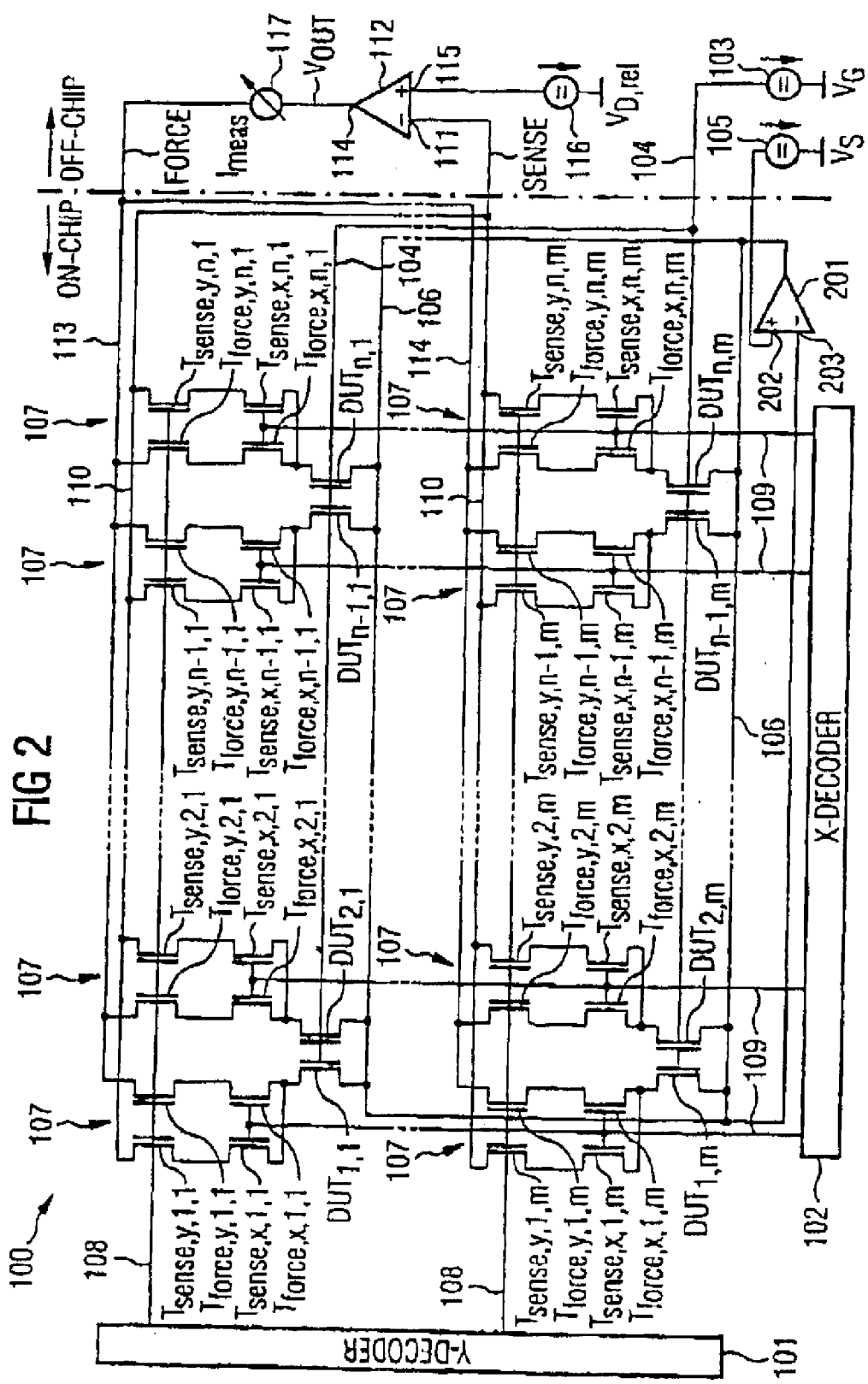

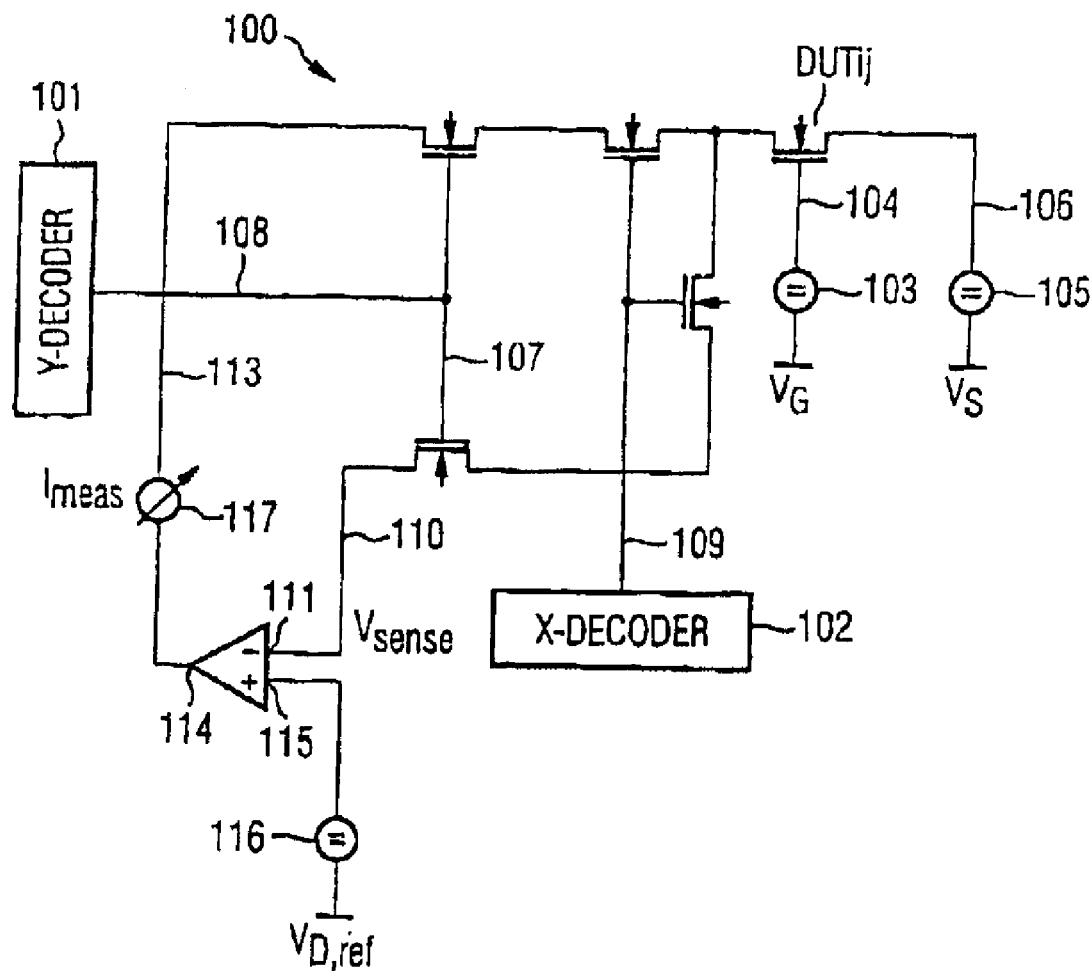

TEST CIRCUIT ARRANGEMENT AND METHOD FOR TESTING A MULTIPLICITY OF TRANSISTORS

The invention relates to a test circuit arrangement and a method for testing a multiplicity of transistors.

Such a test circuit arrangement and such a method are known from [1] and [2].

When semiconductor elements are manufactured, in particular when wafers are manufactured, there is frequently the problem that, owing to the local arrangement of individual circuit elements on the wafer and owing to different conditions during the manufacture of the wafer, the circuit elements of the same type on the wafers have different properties.

A customary electrical circuit element which is used in the field of semiconductor technology is a transistor, in particular a MOS field effect transistor.

If the MOS field effect transistors are used in analog circuits, it is often necessary to have the most precise knowledge possible of the properties of the circuit elements which are manufactured in a particular manufacturing process under given manufacturing conditions and thus have knowledge of their behavior in an analog circuit.

Owing to the differences and irregularities presented above in the manufacturing process of a chip on a wafer, the transistors have very different properties even within a chip on the wafer.

These different properties of the transistors are usually referred to as a mismatching of the (MOS) field effect transistors.

This mismatching, that is to say the different properties of the field effect transistors in a wafer or in transistors of wafers which have been manufactured under identical manufacturing conditions lead, if a circuit designer does not have precise knowledge of the properties of the respectively used field effect transistor, to considerable uncertainties, in particular when designing an analog electrical circuit which contains such field effect transistors.

For this reason, it is necessary to obtain knowledge of the properties of manufactured field effect transistors.

In order to determine the properties of the transistors it is possible to use a test structure with reference transistors, on a reference wafer which has also been manufactured under the manufacturing conditions to be investigated.

The properties of the field effect transistor or transistors which have been determined by means of such a test structure and have been manufactured under identical manufacturing conditions are, like the reference wafer with the reference field effect transistors, made available to the circuit designer who can incorporate these properties in his design of a circuit, enabling a more reliable and dependable design of an electrical, in particular analog, circuit with such field effect transistors.

Principles of what is referred to as mismatching are described in [3] and [4].

The test circuit arrangement known from [1] and [2] has transistors to be tested which are arranged in a matrix in columns and rows. The transistors to be tested are used to connect a column decoder and a row decoder which serve together as an address decoder for selecting the respective transistor to be tested.

Furthermore, selector transistors for disconnecting or selecting the transistors to be tested are connected between the column decoders and the row decoders.

Each transistor to be tested is arranged in a diode circuit, that is to say the gate terminal of the field effect transistor to be tested is short-circuited to its drain terminal.

The large signal behavior of the field effect transistors which are to be tested and are connected to one another is investigated with the test circuit arrangement described from [1] and [2].

A small signal analysis, that is to say the determination of the signal behavior of the field effect transistor which is to be investigated, that is to say to be tested, is not possible with the test circuit arrangement described in [1] and [2].

In particular in the case of field effect transistors which are arranged very close to one another, it is extremely difficult to determine the small signal behavior ($g_{DS}$) of a field effect transistor in a region of approximately ½ μm to 1 μm and less distance from one another, in particular owing to the small incline of the output characteristic curve of a field effect transistor which is to be tested.

Such a test circuit arrangement must thus satisfy stringent requirements in terms of the precision of the test results.

This is particularly important when determining the steepness $g_m$ of a MOS field effect transistor and the differential internal conductance $g_{DS}$, as in particular when determining the differential output conductance $g_{DS}$ a very high degree of precision is necessary as the gradient of the function of the drain current is generally very small about a predefined working point, depending on the drain voltage which is present at the field effect transistor.

The steepness $g_m$ of a MOS field effect transistor is determined in accordance with the following rule:

$$g_m = \frac{\partial I_D}{\partial V_G}\bigg|_{V_D=const}, \qquad (1)$$

$I_D$ being a drain current which flows through the field effect transistor, and $V_G$ being a gate voltage which is present at the gate terminal of the field effect transistor.

The differential internal conductance $g_{DS}$ of a MOS field effect transistor is determined in accordance with the following rule:

$$g_{DS} = \frac{\partial I_D}{\partial V_D}\bigg|_{V_G=const}, \qquad (2)$$

$V_D$ being a drain voltage which is present at the drain terminal of the field effect transistor.

In [5] there is a description of how the electrical properties of a MOS transistor which is considered in isolation can be determined on the basis of successive application of a voltage pulse to the gate electrode, and of a voltage pulse to the source electrode.

[6] describes a circuit arrangement with which it is possible to test whether or not an N-MOS field effect transistor which is connected to a P-MOS field effect transistor functions or not. According to this circuit arrangement, the operational capability of in each case a maximum of two transistors can be tested. It is also to be noted that according to [6] only the large signal behavior is determined. It is not possible to determine the small signal behavior with the circuit arrangement described in [6].

Principles relating to the method of determining the small signal behavior in a field effect transistor are presented in [7].

The invention is thus based on the problem of specifying a test circuit arrangement and a method for testing a multiplicity of transistors which are connected to one another, with which test circuit arrangement and method it is possible to determine precisely the small signal behavior of field effect transistors in an automated fashion.

The problem is solved by means of the test circuit arrangement and by means of the method for testing a multiplicity of transistors having the features according to the independent patent claims.

In a test circuit arrangement for testing a multiplicity of transistors, a multiplicity of transistors to be tested are provided which are connected to one another. The test circuit arrangement also has an electrical selector unit which is connected to the transistors to be tested, for selecting at least one transistor to be tested. In addition, a gate voltage source is provided which can be connected to the gate terminal of each transistor to be tested. A source voltage source can be connected to the source terminal of each transistor to be tested. A measuring unit which is connected to the drain terminals of the transistors to be tested is provided for measuring the drain current which flows through the respectively selected transistor.

In a method for testing a multiplicity of transistors which are connected to one another, a transistor to be tested is selected from the multiplicity of transistors to be tested by means of an electrical selector unit. A gate voltage, a drain voltage or a source voltage is applied to the gate, the drain or the source of the selected transistor and varies around a predefined working point of the transistor to be tested. The drain current which is obtained on the basis of the applied gate voltage, drain voltage or source voltage and which flows through the selected transistor is measured. The small signal behavior of the transistor to be investigated is determined from the measured drain currents and the associated applied gate voltages, drain voltages or source voltages. These steps are carried out for all the transistors which are to be investigated, using selector transistors.

In each case a voltage is usually varied and the further voltages are usually kept constant at a predefined working point (for example, when determining the $g_{DS}$ the drain voltage is varied and the source voltage and gate voltage are kept constant at the selected working point).

The invention permits the small signal behavior of the field effect transistors to be tested to be determined in an automated fashion with a high degree of precision.

This is particularly due to the fact that both the gate terminal of each transistor to be tested and the source terminal of each transistor to be tested can be actuated individually, and the corresponding gate voltage or source voltage can be varied precisely about a predefined working point so that the detection of the resulting drain current which flows through the selected field effect transistor is virtually immune to interference influences.

In this way, the small signal behavior of the tested transistors can be determined very precisely by means of the test circuit arrangement, as a result of which in particular analog circuits which use field effect transistors and which are manufactured in the same way as the field effect transistors which had been investigated in the test circuit arrangement can be designed more precisely and reliably.

Small signal behavior is to be understood, for example, as the steepness $g_m$, the differential output conductance $g_{DS}$, the threshold voltage $V_T$ of the field effect transistor and the dynamic power amplification of a field effect transistor in the emitter circuit $\beta$.

Preferred developments of the invention emerge from the dependent claims.

The further refinements of the invention relate both to the test circuit arrangement and to the method for testing a multiplicity of transistors.

The transistors to be tested can be arranged in pairs, their gate terminals being connected to one another in each case, and the source terminals being connected to one another in each case.

The paired arrangement of the transistors to be tested provides further compensation of possible interference influences. In addition, a paired arrangement of transistors corresponds to a customary arrangement whose properties are extremely interesting for circuit designers.

In order to determine more easily the small signal behavior in a test circuit arrangement of several hundred field effect transistors to be tested there is provision, in one refinement of the invention, to arrange each pair of transistors at a predefined distance from one another. The predefined distance is preferably equal for all pairs of transistors.

In a further refinement of the invention, at least one selector transistor is provided for each transistor to be tested, for selecting the transistor to be tested, the at least one selector transistor being connected to the electrical selector unit. Four selector transistors are preferably provided for each transistor to be tested in order to ensure reliable disconnection of the field effect transistors which are not selected from the field effect transistor which is selected.

According to a further refinement of the invention, the transistors to be tested and/or the selector transistors are MOS field effect transistors.

The transistors to be tested can be arranged in the form of a matrix in rows and columns, and the electrical selector unit can have a column decoder and a row decoder which together form an addressing unit for selecting a transistor to be investigated, in a row and a column of the matrix.

This refinement provides a test circuit arrangement which is very regular and thus compact and cost effective to manufacture.

The column decoder and/or the row decoder can be shift registers.

The implementation of the column decoder and/or row decoder as a shift register enables quick and easy automatic addressing, that is to say the automatic selection of the field effect transistor to be tested within the scope of the overall selection, that is to say within the scope of the overall test, in which all the field effect transistors of the test circuit arrangement which are to be tested have to be tested.

A more complex addressing mechanism for addressing a transistor to be tested within a matrix is thus not necessary. However, it is to be noted that it is also possible to provide any desired addressing mechanism, for example the selector unit can be formed by means of free addressing registers which are filled, by an external control unit, with the corresponding addresses of the transistor to be respectively tested, within the matrix.

In a further refinement of the invention, a first operational amplifier is provided whose non-inverting input is connected to a drain reference voltage source.

The inverting input of the first operational amplifier is connected to the drain terminals of the transistors to be tested, in such a way that a parasitic voltage drop at the selector transistors can be compensated.

The first operational amplifier makes it possible, as is apparent in the arrangement described above, to ensure self-compensation of interference influences within the circuit arrangement, by means of the regulating circuit which is formed by means of the first operational amplifier.

In alternative embodiments, it is also possible to use alternative regulating mechanisms and regulators within the framework of the test circuit arrangement according to the invention.

Furthermore, a second operational amplifier can be provided whose non-inverting input is connected to the source voltage source as a reference voltage source. The inverting input of the second operational amplifier is connected to the source terminals of the transistors to be tested in such a way that a parasitic voltage drop at the connections between the transistors can be compensated. The output of the second operational amplifier is connected to the source terminals of the transistors to be investigated.

This refinement further increases the precision of the test result, in particular when there is a growing number of transistors which are to be tested and which are contained in the test circuit arrangement.

It is to be noted that basically any desired number of field effect transistors can be contained in the test circuit arrangement.

An exemplary embodiment of the invention is represented in the figures and will be explained in more detail below.

FIG. 1 shows a test circuit arrangement according to an exemplary embodiment of the invention;

FIG. 2 shows a test circuit arrangement according to an exemplary embodiment of the invention with an additional second operational amplifier;

FIG. 3 shows an outline with which the principle on which the exemplary embodiment of the invention is based is illustrated.

FIG. 1 shows a test circuit arrangement 100 according to an exemplary embodiment of the invention.

The test circuit arrangement 100 has, as selector means, a row decoder 101 and a column decoder 102. The row decoder 101 and the column decoder 102 are each embodied as a shift register.

By suitably actuating the shift registers, the row connections and column connections contained in the test circuit arrangement 100 are successively actuated on a column basis and/or row basis.

The test circuit arrangement 100 has, with n rows and m columns (number m of columns and number n of rows can of course differ from each other) n×m field effect transistors $DUT_{ij}$ to be tested, each field effect transistor to be tested being unambiguously designated within the test circuit arrangement 100 with a column index i (i=1, ..., n) and with a column index j (j=1, ..., n).

The field effect transistors $DUT_{ij}$ to be tested are each arranged in pairs in a row in such a way that in each case the gate terminals of all the field effect transistors $DUT_{ij}$ which are arranged in a row are connected to one another, and also to a gate voltage source 103 via a gate line 104.

In addition, the source terminals of all the field effect transistors $DUT_{ij}$ to be tested within a row are connected to one another and to a source voltage source 105 via a source line 106.

Each drain terminal of a field effect transistor $DUT_{ij}$ to be tested is connected to a disconnection unit 107 which has 4 field effect transistors $T_{sense,y,i,j}$, $T_{force,y,i,j}$, $T_{sense,x,i,j}$, $T_{force,x,i,j}$.

The source terminal of a first field effect transistor $T_{sense,x,i,j}$ is connected to the source terminal of a second field effect transistor $T_{force,x,i,j}$ and the drain terminal of the field effect transistor $DUT_{ij}$ which is to be respectively tested.

The two gate terminals of the first field effect transistor $T_{sense,x,i,j}$ and of the second field effect transistor $T_{force,x,i,j}$ are connected to one another and to the row connection 108, that is to say the address line i and via it to the row decoder 101.

The drain terminal of the first field effect transistor $T_{sense,x,i,j}$ is connected to the source terminal of a third field effect transistor $T_{sense,y,i,j}$.

The drain terminal of the second field effect transistor $T_{force,x,i,j}$ within the disconnection unit 107 is connected to the source terminal of a fourth field effect transistor $T_{force,y,i,j}$.

The gate terminals of, in each case, the third field effect transistor $T_{sense,y,i,j}$ and of the fourth field effect transistor $T_{force,y,i,j}$ of, in each case, all the disconnection units 107 of a row within the test circuit arrangement 100 are connected to one another and via a column connection 109 to the column decoder 102.

The source terminals of the third field effect transistors $T_{sense,y,i,j}$ of all the disconnection units 107 are connected to one another and via a line 110 to an inverting input 111 of an operational amplifier 112.

The source terminals of all the fourth field effect transistors $T_{force,y,i,j}$ of all the disconnection units 107 within the test circuit arrangement 100 are connected to one another and via a further line 113 to an output 114 of the operational amplifier 112.

The non-inverting input 115 of the operational amplifier 105 is connected to a drain reference voltage source 116 which supplies a drain reference voltage $V_{D,ref}$.

In addition, a current measuring device 117 for determining the drain current $I_D$ flowing through the respective field effect transistor $DUT_{ij}$ to be tested is connected between the output 1114 of the operational amplifier 112 and the further line 113.

It is to be noted that the operational amplifier 112 may either be in the test circuit arrangement 100 or outside the test circuit arrangement 100, that is to say may or may not form a chip with the test circuit arrangement.

According to the exemplary embodiment, the source monitoring unit (SMU) of a parameter analyzer by Hewlett-Packard™ HP4156B is used as a current measuring device 117 and to implement the operational amplifier 112.

The operational amplifier 112 implements a regulating circuit by means of which the drain voltage $V_D$ which is made available by the field effect transistors $DUT_{ij}$ to be tested is regulated. In particular, the operational amplifier 112 and its wiring within the test circuit arrangement 100 ensure that the parasitic voltage drop at the field effect transistors $T_{force,y,i,j}$ and $T_{force,x,i,j}$ is automatically compensated within the disconnection unit 107.

In this way it is possible for current losses and voltage losses within the measurement path of the field effect transistor $DUT_{ij}$ to be tested to be negligibly small.

The test circuit arrangement 100 is operated within the scope of the measuring phase in such a way that for each field effect transistor $DUT_{ij}$ to be tested for one or more working points is varied in each case by varying the gate voltage or the drain voltage which is applied to the respective field effect transistor $DUT_{ij}$ to be tested, and the drain current which flows through the selected field effect transistor $DUT_{ij}$ to be tested is determined for each changed voltage value.

The small signal parameter steepness $g_m$ and the differential internal conductance value $g_{DS}$ of a field effect transistor are determined by means of numerical differentiation of the drain current $I_D$ according to the following rules:

$$g_m(V_G, V_D) \approx \frac{I_D\left(V_G + \frac{1}{2}\Delta V_G, V_D\right) - I_D\left(V_G - \frac{1}{2}\Delta V_G, V_D\right)}{\Delta V_G}, \quad (3)$$

and

-continued $$g_{DS}(V_G, V_D) \approx \frac{I_D\left(V_G, V_D + \frac{1}{2}\Delta V_D\right)^{15} - I_D\left(V_G, V_D - \frac{1}{2}\Delta V_D\right)}{\Delta V_D}, \quad (4)$$

with the parameters $\Delta V_G$ and $\Delta V_D$ each designating a small signal change of the applied gate voltage $V_G$ and drain voltage $V_D$ about a predefined working point of the selected field effect transistor $DUT_{ij}$.

In particular as the difference between the two currents in rule (4) for determining the differential internal conductance $g_{DS}$ is small compared with the absolute values of the drain current $I_D$, the effect of measuring errors should be taken into account and compensated.

In addition it is to be noted that in an alternative, the threshold voltage $V_T$ of the field effect transistor to be tested and the variable β can also be determined.

FIG. 2 shows the test circuit arrangement 100 from FIG. 1 with an additional second operational amplifier 201 whose non-inverting input 202 is connected to the source voltage source 105.

The inverting input 203 of the second operational amplifier 201 is connected to all the source terminals of all the field effect transistors $DUT_{ij}$ to be tested.

FIG. 3 shows, in order to further illustrate the procedure, a basic diagram of the test circuit arrangement 100 for the case in which precisely one field effect transistor $DUT_{ij}$ to be tested is selected.

All the further field effect transistors of the test circuit arrangement 100 which are to be tested and which are not currently selected are not illustrated in FIG. 3.

The basic structure of the terminals of the test circuit arrangement corresponds to the test circuit arrangement from FIG. 1 and FIG. 2.

It is to be noted that the field effect transistors of the disconnection units 107 do not influence the measurement.

Furthermore it is to be noted that the invention relates both to PMOS field effect transistors and thereto NMOS field effect transistors.

The following publications are cited in this document:
[1] C. Linnenbank et al., What Do Matching Results of Medium Area MOSFETs Reveal for Large Area Devices in Typical Analog Applications?, Proceedings of the 28th European Solid-State Device Research Conference, ESS-DRC 1998, Bordeaux, France, pp. 104–107, Sep. 8–10, 1998
[2] M. Eisele et al., Intra-Die Device Parameter Variations and Their Impact on Digital CMOS Gates at Low Supply Voltages, IEEE, IEDM 1995, pp. 67–70, 1995
[3] K. R. Lakshmikumar et al., Characterization and Modeling of Mismatch in MOS Transistors for Precision Analog Design, IEEE Journal of Solid-State Circuits, Vol. SC-21, No. 6, pp. 1057–1066, December 1986
[4] M. J. M. Pelgrom et al., Transistor Matching in Analog CMOS Applications, IEEE, International Electron Devices Meeting, San Francisco, Calif., IEDM 98, pp. 915–918, Dec. 6–9, 1998
[5] K. Goser, "MOS-Transistoren als schnelle Schalter in einer Auswahlmatrix [MOS transistors as high-speed switches in a selection matrix]", NTZ, Issue 10, pages 512 to 521, 1970
[6] DE 692 17 827 T2
[7] R. Paul, "Feldeffekttransistoren [Field effect transistors]", Verlag Berliner Union GmbH, Stuttgart, pages 249 to 264, 1972

List of Reference Numerals
100 Test circuit arrangement
101 Row decoder
102 Column decoder
103 Gate voltage source
104 Gate line
105 Source voltage source
106 Source line
107 Disconnection unit
108 Row connection
109 Column connection
110 Line
111 Inverting input of operational amplifier
112 Operational amplifier
113 Further line
114 Output of operational amplifier
115 Non-inverting input of operational amplifier
116 Drain reference voltage source
$T_{sense,x,i,j}$ First field effect transistor of disconnection unit
$T_{force,x,i,j}$ Second field effect transistor of disconnection unit
$T_{sense,y,i,j}$ Third field effect transistor of disconnection unit
$T_{force,y,i,j}$ Fourth field effect transistor of disconnection unit
201 Second operational amplifier
202 Non-inverting input of second operational amplifiers
203 Inverting input of second operational amplifiers

What is claimed is:

1. A test circuit arrangement for testing a multiplicity of transistors, the test circuit arrangement comprising:
   a multiplicity of transistors which are to be tested and which are connected to one another;
   an electrical selector unit, connected to the transistors to be tested, for selecting at least one transistor to be tested;
   a gate voltage source which can be connected to the gate terminal of each transistor of to be tested;
   a source voltage source which can be in operational communication with the source terminal of each transistor to be tested; and
   a measuring unit connected to the drain terminals of the transistors to be tested for measuring the drain current which flows through the respectively selected transistor.

2. The test circuit arrangement as claimed in claim 1, in which the transistors to be tested are arranged in pairs, their gate terminals being connected to one another in each case, and their source terminals being connected to one another in each case.

3. The test circuit arrangement as claimed in claim 2, in which each pair of transistors is arranged at a predefined distance from one another.

4. The test circuit arrangement as claimed in claim 3, in which the predefined distance is equal for all pairs of transistors.

5. The test circuit arrangement as claimed in claim 1, in which at least one selector transistor is provided for each transistor to be tested, for selecting the transistor to be tested, the at least one selector transistor being connected to the electrical selector unit.

6. The test circuit arrangement as claimed in claim 5, in which four selector transistors are provided for each transistor to be tested.

7. The test circuit arrangement as claimed in claim 1, in which the transistors to be tested or the selector transistors are MOS field effect transistors.

8. The test circuit arrangement as claimed in claim 1, in which the transistors to be tested are arranged in a matrix with rows and columns, and in which the electrical selector unit has a column decoder and a row decoder for selecting a transistor to be investigated, in a row and a column of the matrix.

9. The test circuit arrangement as claimed in claim 8, in which the column decoder or the row decoder are one shift register/two shift registers.

10. The test circuit arrangement as claimed in claim 5, in which a first operational amplifier is provided, the first operational amplifier further comprising:

a non-inverting input that is connected to a drain reference voltage source; and an inverting input that is in operational communication with the drain terminals of the transistors to be tested, in such a way that a parasitic voltage drop at the selector transistor can be compensated.

11. The test circuit arrangement as claimed in claim 5, in which a second operational amplifier is provided, the second operational amplifier comprising:

a non-inverting input is connected to a source reference voltage source; and wherein an inverting input is fed back to the source terminals of the transistors to be investigated in such a way that a parasitic voltage drop at the connections between the transistors can be compensated; and whose output is connected to the source terminals of the transistors to be tested.

* * * * *

UNITED STATES PATENT AND TRADEMARK OFFICE
CERTIFICATE OF CORRECTION

PATENT NO. : 6,873,173 B2
DATED : March 29, 2005
INVENTOR(S) : Ute Kollmer

It is certified that error appears in the above-identified patent and that said Letters Patent is hereby corrected as shown below:

Title page,
Item [30], Foreign Application Priority Data, after "100 11 657" add -- .4 --.

Column 4,
Lines 56 - 64, should read as one continuous paragraph.

Column 8,
Line 35, delete "of".

Signed and Sealed this

Seventh Day of February, 2006

JON W. DUDAS
*Director of the United States Patent and Trademark Office*